(12) United States Patent
Lederer

(10) Patent No.: US 6,858,376 B2
(45) Date of Patent: Feb. 22, 2005

(54) PROCESS FOR STRUCTURING A PHOTORESIST LAYER ON A SEMICONDUCTOR SUBSTRATE

(75) Inventor: Kay Lederer, Dresden (DE)

(73) Assignee: Infineon Technologies AG, Munich (DE)

(*) Notice: Subject to any disclaimer, the term of this patent is extended or adjusted under 35 U.S.C. 154(b) by 123 days.

(21) Appl. No.: 10/213,413

(22) Filed: Aug. 5, 2002

(65) Prior Publication Data
US 2003/0027087 A1 Feb. 6, 2003

(30) Foreign Application Priority Data
Aug. 3, 2001 (DE) .......................... 101 38 103

(51) Int. Cl.⁷ ................................ G03F 7/26
(52) U.S. Cl. ...................... 430/311; 430/330
(58) Field of Search .................. 430/311, 322, 430/327, 330

(56) References Cited

U.S. PATENT DOCUMENTS 3,716,390 A * 2/1973 Garbarini .................... 216/41
4,606,994 A    8/1986 Illers et al. ................ 430/300

FOREIGN PATENT DOCUMENTS

GB    2 339 479 A    1/2000

* cited by examiner

Primary Examiner—Kathleen Duda
(74) Attorney, Agent, or Firm—Laurence A. Greenberg; Werner H. Stemer; Gregory L. Mayback

(57) ABSTRACT

In a negative or positive photoresist layer structured with the aid of the customary lithography technique, the photoresist layer is heated briefly, in the region of the interface with the semiconductor substrate, to a temperature above the melting point to fuse the photoresist layer at the interface with the layer underneath on the semiconductor wafer.

24 Claims, 3 Drawing Sheets

PROCESS FOR STRUCTURING A PHOTORESIST LAYER ON A SEMICONDUCTOR SUBSTRATE

BACKGROUND OF THE INVENTION

Field of the Invention

The invention relates to a process for forming a structured photoresist layer on a semiconductor substrate, and a photoresist for use in such a process.

Integrated circuits on semiconductor substrates are generally produced with the aid of the planar technique. In the planar technique, local processing of semiconductor wafers is carried out by using lithographic methods. In the photolithographic methods, a thin radiation-sensitive film, a so-called photoresist layer, is first deposited on the semiconductor wafer. The photoresist layer is exposed to light through a suitable mask that contains the structure to be formed in the semiconductor substrate. Alternatively, however, X-rays may also be used for producing the structures on the photoresist layer. Furthermore, it is also possible to form the desired structures directly on the photoresist with the aid of an electron beam.

After the structures have been produced on the photoresist layer, the resist is developed and then cured. The structure so produced in the photoresist layer is then transferred with the aid of special etching methods into the semiconductor layer underneath. However, the photoresist layer itself can also serve for local masking of the semiconductor layer, for example, for an ion implantation.

Photolithography can be divided into a positive and a negative resist technique. In the positive resist technique, the photoresist becomes detached in the exposed parts on development of the resist, whereas the unexposed parts remain masked. In the negative resist technique, the situation is exactly the opposite. The exposed parts remain masked after development of the resist, whereas the unexposed parts dissolve during the development.

The increasing miniaturization of the integrated circuits necessitates the formation of increasingly small structure widths in the photoresist layer in the photolithography technique. The use of the structured photoresist layer as an etching mask for structuring the semiconductor layer underneath simultaneously requires a predetermined minimum layer thickness to ensure that the photoresist layer withstands the etching. As a result, with increasingly small component widths, the aspect ratio of the photoresist structures, i.e., the ratio of width to height of the individual structures, is becoming increasingly unfavorable. This increases the danger that the resist structures will collapse during the subsequent process step, which can then lead to incorrect structures on transfer of the resist structures to the semiconductor layer and, hence, to incorrect integrated circuits.

To prevent a collapse of the resist structures, good resist adhesion on the semiconductor surface is, therefore, necessary. To improve the adhesion of the photoresist on the semiconductor surface, surface wetting with a so-called primer, in the case of silicon wafers usually hexamethyldisilazane (HMDS), is generally carried out before application of the resist. The wetting of the silicon wafer with HMDS produces an organic surface that ensures a large contact angle with the customarily likewise organic photoresist layer and, hence, provides a large contact area. As an alternative to the use of HMDS as a primer, an organic antireflection layer that, similarly to the HMDS layer, produces an organic surface on the silicon wafer and additionally ensures a reduction in reflection on exposure of the photoresist layer is also used between the photoresist layer and the semiconductor substrate. In spite of the use of such primers, however, there is still the danger of a collapse of the photoresist structures, in particular, in the case of structure widths in the sub-$\mu$m range.

SUMMARY OF THE INVENTION

It is accordingly an object of the invention to provide a process for structuring a photoresist layer on a semiconductor substrate that overcomes the hereinafore-mentioned disadvantages of the heretofore-known devices and methods of this general type and that ensures improved resist adhesion on the semiconductor surface.

With the foregoing and other objects in view, there is provided, in accordance with the invention, a method of forming a structured photoresist layer on a semiconductor wafer, including the steps of applying a negative photoresist layer over substantially all of an uppermost layer of the semiconductor wafer at an interface, the negative photoresist having components, exposing portions of the negative photoresist layer to form a structure on the negative photoresist layer, developing the negative photoresist layer to remove the negative photoresist layer in unexposed portions, and heating the structured negative photoresist layer in a region of the interface to a temperature above a melting point of at least one of the components of the negative photoresist to fuse the negative photoresist layer at the interface with the uppermost layer. Alternatively, the photoresist layer is applied over at least a portion of an uppermost layer of the semiconductor wafer.

With the objects of the invention in view, there is also provided a method of forming a structured photoresist layer on a semiconductor wafer, including the steps of applying a positive photoresist layer over substantially all of an uppermost layer of the semiconductor wafer at an interface, the positive photoresist having components, exposing portions of the positive photoresist layer to form a structure on the positive photoresist layer, developing the positive photoresist layer to remove the positive photoresist layer in the exposed portions, and heating the structured positive photoresist layer in a region of the interface to a temperature above a melting point of at least one of the components of the positive photoresist to fuse the positive photoresist at the interface with the uppermost layer. Alternatively, the photoresist layer is applied over at least a portion of an uppermost layer of the semiconductor wafer.

According to the invention, in the case of a negative or positive photoresist layer structured with the aid of the conventional lithography technique, the photoresist layer is briefly heated, in the region of the interface with the layer underneath, to a temperature above the temperature at which at least one component of the photoresist layer melts, also referred to below as the melting point, in order to fuse the photoresist layer at the interface with the layer underneath.

By the photoresist structuring technique according to the invention, mechanical stabilization of the photoresist lines on their substrate is achieved. The melting of the photoresist layer at the interface with the layer underneath ensures that components of the photoresist layer penetrate into the layer and can fuse with it at the interface. Consequently, a stronger interaction between the photoresist layer and the layer underneath is achieved.

In accordance with another mode of the invention, the temperature to which the photoresist layer is heated is only about 0.1° C. above the melting point. Such a process reliably ensures that a transition from the solid to the liquid form in the photoresist layer takes place only in the region of the interface, i.e., the photoresist layer melts only in monolayer thickness, whereas the remaining parts of the photoresist layer remain solid, which ensures that the structure of the photoresist layer and, hence, the mask pattern transferred during the exposure process is not changed.

In accordance with a further mode of the invention, the substantially immediate solidification of the photoresist layer is produced by cooling after the heating step. The heating step is followed by a further cooling step that ensures careful solidification of the molten photoresist layer. Such a process ensures that the change in the photoresist structure as a result of the melting process is as small as possible.

In accordance with an added mode of the invention, a layer including a component whose melting point substantially corresponds to the melting point of the photoresist is provided as the uppermost layer on the semiconductor wafer. Consequently, not only the photoresist layer at the interface but also the layer underneath is melted during the heating. As a result, these two layers flow into one another at the interface and ensure optimum fusion and, hence, stronger adhesion of the photoresist lines.

In accordance with an additional mode of the invention, the semiconductor wafer has, as the uppermost layer, a layer including a component having a melting point substantially corresponding to the melting point of the photoresist, and the uppermost layer melts at the interface when the photoresist layer is heated at the interface.

In accordance with yet another mode of the invention, the semiconductor wafer has, as the uppermost layer, a layer including a component having a melting point substantially corresponding to the melting point of the at least one component of the photoresist and the uppermost layer melts at the interface when the photoresist layer is heated at the interface.

In accordance with a concomitant mode of the invention, the uppermost layer has a component with a melting point substantially corresponding to the melting point of the at least one component of the photoresist, and the component of the uppermost layer melts at the interface when the photoresist layer is heated at the interface.

Other features that are considered as characteristic for the invention are set forth in the appended claims.

Although the invention is illustrated and described herein as embodied in a process for structuring a photoresist layer on a semiconductor substrate, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
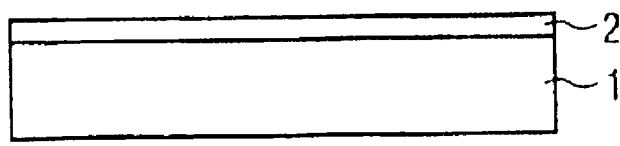
FIGS. 1A to 1F are diagrammatic, fragmentary, cross-sectional views of various steps in a lithography process using a negative resist according to the invention.

Highly integrated circuits are customarily realized in semiconductor wafers with the aid of the planar technique. In the planar technique, the structuring of the semiconductor wafers is always carried out with the aid of the lithographic technique. The substantial feature of this technique is a radiation-sensitive photoresist layer that is irradiated in the desired parts so that only the exposed or unexposed parts are removed in a suitable developer. The resist pattern thus formed then serves as a mask for a subsequent process step, for example, etching or ion implantation. At the end, the resist mask is removed. Ultraviolet light, X-rays and accelerated electrons and ions are suitable for irradiation of the photoresist.

Lithography can, in principle, be divided into a positive and a negative resist technique. In the positive resist technique, the photoresist dissolves in the exposed parts during development and the unexposed parts remain masked. Conversely, in the negative resist technique, the exposed parts are masked and the unexposed resist dissolves during the development. The stability and mechanical load capacity of the structured photoresist layer remain a fundamental problem. Due to the increasing miniaturization of the integrated circuits on the semiconductor wafers, increasingly small resist structures are required, which increases the danger that these resist structures will be damaged or will collapse in the subsequent process, with the result that incorrect masking or structuring of the semiconductor layers and, hence, incorrect integrated circuits could occur.

To achieve improved resist adhesion, it is proposed, according to the invention, to heat the structured photoresist layer briefly on the semiconductor wafer after the development process, and the region of the interface with the layer underneath, to a temperature above the temperature at which at least one component of the photoresist layer melts, also referred to below as the melting point, to fuse the photoresist layer at the interface with the layer underneath and, thus, to ensure bonding of the photoresist layer with the layer underneath. As a result, improved adhesion of the structured photoresist layer is achieved, with which it is possible to obtain, even in the case of structures in the sub-$\mu$m range, sufficiently high stabilities that prevent a collapse of the resist structure in subsequent processes.

The lithography technique according to the invention can be used both in the positive and in the negative resist technique, as described by way of example below.

Referring now to the figures of the drawings in detail and first, particularly to FIGS. 1A to 1F thereof, there is shown a process sequence for producing a resist line on the surface of the silicon wafer with the aid of a negative photoresist.

Negative photoresists are, in general, polymers that contain a solid matrix fraction and a photosensitive fraction. The matrix fraction substantially determines the thermal properties of the resist. The photosensitive fraction establishes the wavelength range and the sensitivity of the resist. The negative photoresist is configured so that, in the unexposed state, it can be dissolved by developer solutions, preferably, alkalis. The exposure to light initiates a chemical reaction of the photosensitive fraction, which ensures a transformation of the negative photoresist in the exposed parts so that these parts are no longer soluble in the developer liquid.

Before the application of the resist layer, surface wetting of the semiconductor wafer 1 with a so-called primer 2 is generally carried out, as shown in FIG. 1A and also referred to as an adhesion promoter. A primer usually used in the case of silicon wafers is hexamethyldisilazane (HMDS). For surface wetting, the silicon wafer is exposed to the vapor of the HMDS liquid in vacuo or at atmospheric pressure in an oxygen environment so that the silicon surface is wet. As an alternative to an HMDS layer having the thickness of a monolayer, an organic antireflection layer is also often applied prior to resist coating, which antireflection layer additionally serves for preventing reflections of the light wave used for exposing the photoresist layer at the semiconductor surface and, thus, as far as possible, eliminating interference effects.

The organic primer layer or organic antireflection layer on the silicon wafer ensures that free $OH^-$ groups on the silicon surface are saturated, which groups would reduce the contact surface for the resist to be applied and, hence, decrease the adhesion.

Figure 1B:
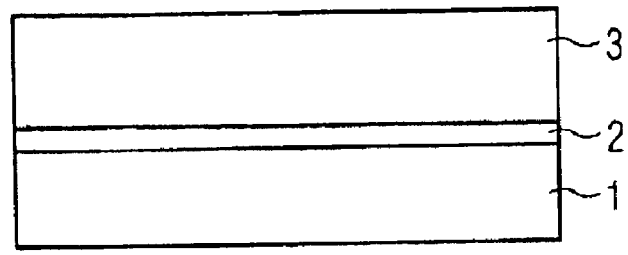
Figure 1C:
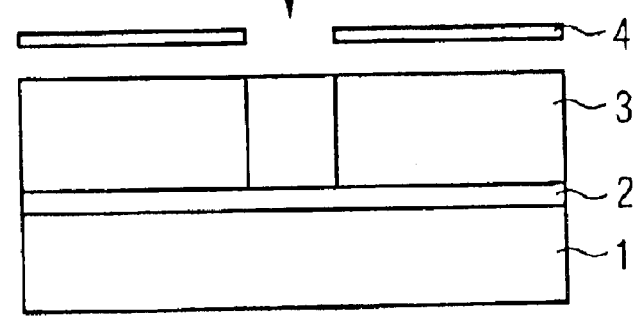
Figure 1D:
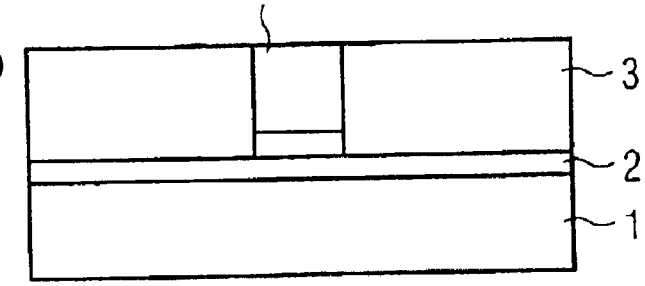
Figure 1E:
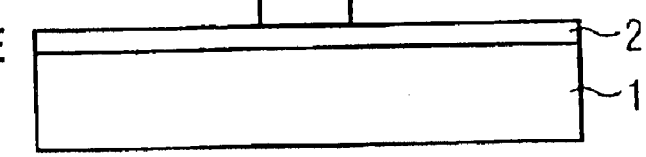
Figure 1F:
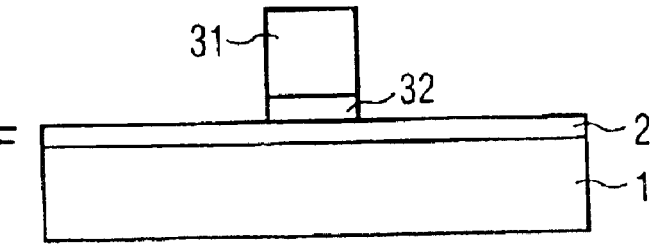

After the negative photoresist 3 has been applied by spin coating, which is shown in FIG. 1B, a thermal aftertreatment is also generally carried out for improving the layer stability, or the semiconductor wafer is dried in a temperature range around 100° C. for a few minutes. The negative photoresist layer 3 is then exposed with the aid of a photomask 4, as shown in FIG. 1C. The photomask 4 contains the pattern of a desired structuring of the semiconductor wafer, in general, as a chromium layer on a transparent support. The pattern of the photomask 4 is reproduced on the photoresist layer 3 with the aid of the exposure radiation, the exposure radiation causing a chemical reaction of the photosensitive components in the negative photoresist. This part is denoted by the reference numeral 31 in the photoresist layer 3 in FIG. 1D. The chemical reaction initiated by the exposure to light ensures that the corresponding part of the photoresist layer can scarcely any longer be attacked by the subsequently used developer solution, i.e., remains insoluble in the developer solution. The semiconductor wafer with the negative photoresist layer after the development step is shown in FIG. 1E. The developer solution ensures that all unexposed parts of the negative photoresist layer 3 are dissolved so that only the exposed part 31 remains behind.

To increase the adhesion of the negative photoresist structure 31 on the semiconductor wafer 1, the resist line 31 remaining behind is heated briefly after the development of the photoresist layer, at the interface with the adhesion promoter 2 underneath, to a temperature that is above the melting point of at least one component of the negative photoresist. The melting point of the negative photoresist components is usually in the range from 140 to 150° C. The temperature at which the interface of the photoresist line 31 with the substrate is heated is preferably chosen so that it is only about 0.1° C. above such melting point. Furthermore, the heating is controlled such that the melting point at the interface of the resist layer is exceeded only for a few seconds. To produce rapid recrystallization of the molten photoresist, a further cooling step, which ensures immediate solidification of the molten photoresist, is, therefore, preferably, carried out after the heating step. In the short time span in which the thin resist film at the interface with the layer underneath is melted, the resist film runs into and penetrates the layer 2 underneath. The penetration results in a fusion layer 32 (FIG. 1F) including the components of the uppermost layer 2 on the semiconductor wafer 1 and of the photoresist layer 3, which, after solidification of the photoresist components, ensure improved adhesion of the resist line on the substrate. The photoresist layer and the layer underneath are preferably chosen so that the melting point of at least one of the material components of the layer present under the photoresist layer is also exceeded at the interface during the heating step. Such a selection provides improved fusion and, hence, a further increase in the adhesion of the resist line after resolidification.

Figure 3A:
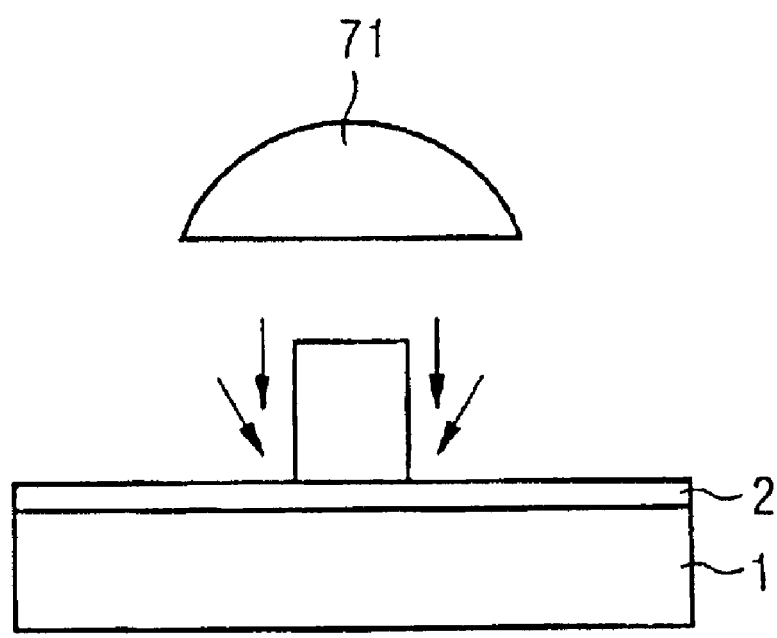
FIGS. 3A and 3B are diagrammatic, cross-sectional views of two different embodiments of heating apparatuses for melting the photoresist layer according to the invention.
Figure 3B:
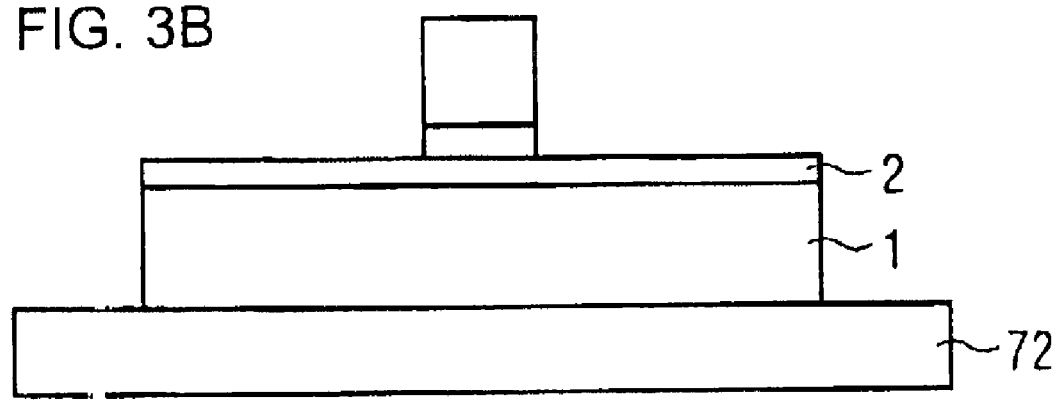

The heating of the interface of the resist line with the layer 2 underneath can be effected, as shown in FIG. 3A, by irradiation, for example, with the aid of an infrared source 71, but, alternatively, as shown in FIG. 3B, a hotplate 72 can also be used. The hotplate 72 is chosen so that its thermal mass remains small compared with the semiconductor wafer 1 to, thus, produce rapid heating. What is decisive thereby is that the heating takes place rapidly and with high homogeneity.

Figure 2A:
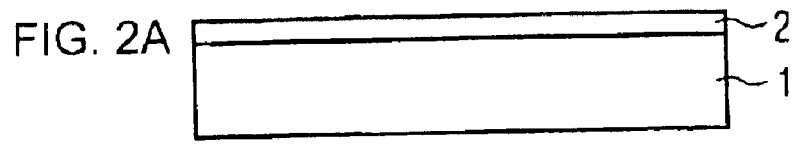
FIGS. 2A to 2F are diagrammatic, fragmentary, cross-sectional views of various steps in a lithography process using a positive resist according to the invention.
Figure 2B:
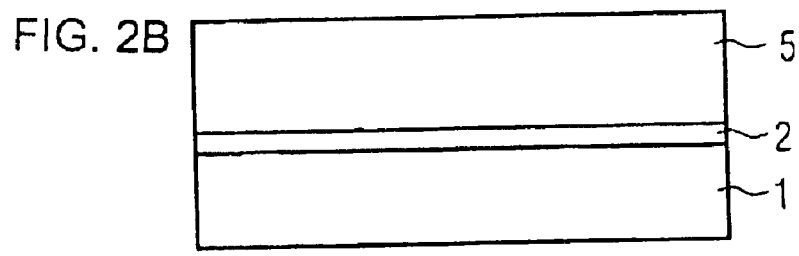
Figure 2C:
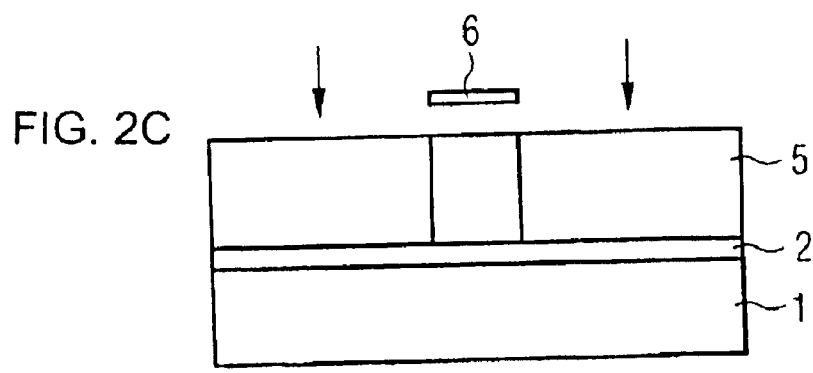
Figure 2D:
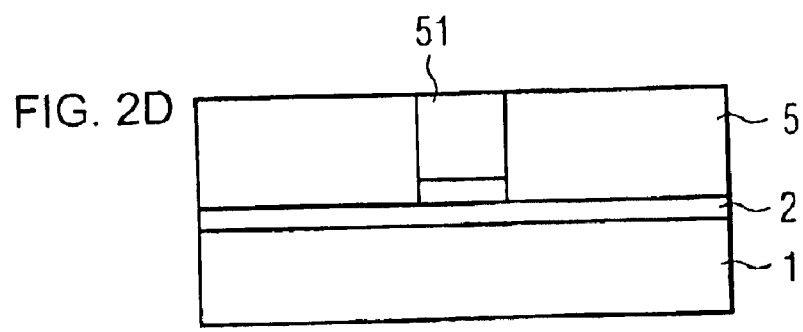
Figure 2E:
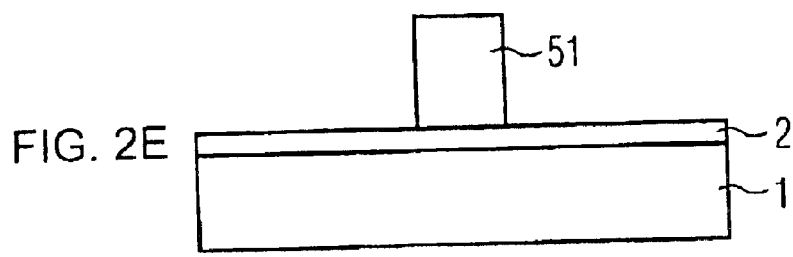
Figure 2F:
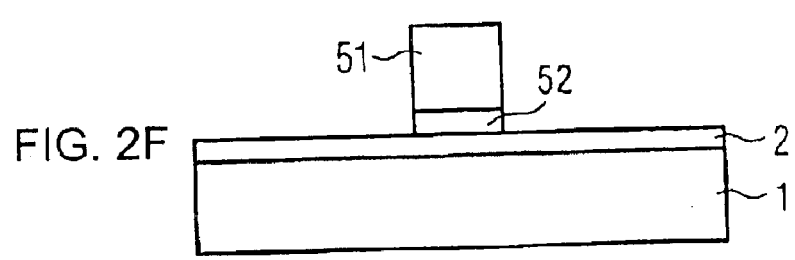

FIGS. 2A to 2F show, as an alternative, a process sequence for structuring a photoresist wafer 2 with a positive photoresist. Positive photoresists generally are of a solid matrix material, a photosensitive fraction, and a solvent. The matrix material is customarily phenol resin. The photosensitive fraction used is, for example, diazonaphthoquinone. The solvent used is ethylene glycol ether/ethyl acetate. Similarly to the negative photoresist, the positive photoresist is applied by spin coating to the semiconductor wafer 1 provided with a primer layer 2, as shown in FIG. 2B. After drying of the photoresist layer 5 applied by spin coating, the layer 5 is scarcely soluble in alkalis, i.e., the photoresist layer 5 is not attacked by developer solutions. Exposure to light (FIG. 2C) through a mask 6 that contains the desired structure to be formed in the photoresist layer ensures that the photosensitive fraction in the photoresist layer 5 is chemically modified (FIG. 2D) so that the developer liquid can dissolve it. Therefore, only the unexposed part of the photoresist 51 remains after the development process, as shown in FIG. 2E.

This positive photoresist line 51 is then subjected, analogously to the negative photoresist line, to a thermal treatment in which the interface with the primer layer 2 underneath is heated for a short time to a temperature above the melting point of at least one of the components of the positive photoresist. Once again, a heating temperature that is about 0.1° C. above the melting point of the positive photoresist, which is generally between 140 and 150° C., is preferably chosen here. The heating of the interface is carried out only for a few seconds, either by exposure to the light source 71, as shown in FIG. 3A, or over a hotplate 72, as shown in FIG. 3B. As a result of the melting of the interface, a thin positive photoresist film, once again, runs into the primer layer underneath, fuses with it and, after resolidification 52, ensures improved adhesion of the resist line on the substrate.

The features of the invention that are disclosed in the above description, the drawings, and the claims may be of importance both individually and in any desired combination for realizing the invention in its various embodiments.

I claim:

1. A method of forming a structured photoresist layer on a semiconductor wafer, which comprises:

applying a negative photoresist layer over substantially all of an uppermost layer of the semiconductor wafer at an interface, the negative photoresist having components;

exposing portions of the negative photoresist layer to form a structure from the negative photoresist layer;

developing the negative photoresist layer to remove the negative photoresist layer in unexposed portions; and heating the structured negative photoresist layer in a region of the interface to a temperature above a melting point of at least one of the components of the negative photoresist to fuse the negative photoresist layer at the interface with the uppermost layer.

2. The method according to claim 1, which further comprises carrying out the heating step to approximately 0.1° C above the melting point of the at least one component of the negative photoresist.

3. The process according to claim 1, which further comprises producing substantially immediate solidification of the negative photoresist layer by cooling after the heating step.

4. The process according to claim 1, wherein:
the semiconductor wafer has, as the uppermost layer, a layer including a component having a melting point substantially corresponding to the melting point of the negative photoresist; and
the uppermost layer melts at the interface when the negative photoresist layer is heated at the interface.

5. The process according to claim 1, wherein:
the semiconductor wafer has, as the uppermost layer, a layer including a component having a melting point substantially corresponding to the melting point of the at least one component of the negative photoresist; and
the uppermost layer melts at the interface when the negative photoresist layer is heated at the interface.

6. The process according to claim 1, wherein:
the uppermost layer has a component with a melting point substantially corresponding to the melting point of the at least one component of the negative photoresist; and
the component of the uppermost layer melts at the interface when the negative photoresist layer is heated at the interface.

7. A method of forming a structured photoresist layer on a semiconductor wafer, which comprises:
applying a negative photoresist layer over at least a portion of an uppermost layer of the semiconductor wafer at an interface, the negative photoresist having components;
exposing portions of the negative photoresist layer to form a structure from the negative photoresist layer;
developing the negative photoresist layer to remove the negative photoresist layer in unexposed portions; and
heating the structured negative photoresist layer in a region of the interface to a temperature above a melting point of at least one of the components of the negative photoresist to fuse the negative photoresist layer at the interface with the uppermost layer.

8. The method according to claim 7, which further comprises carrying out the heating step to approximately 0.1° C above the melting point of the at least one component of the negative photoresist.

9. The process according to claim 7, which further comprises producing substantially immediate solidification of the negative photoresist layer by cooling after the heating step.

10. The process according to claim 7, wherein:
the semiconductor wafer has, as the uppermost layer, a layer including a component having a melting point substantially corresponding to the melting point of the negative photoresist; and
the uppermost layer melts at the interface when the negative photoresist layer is heated at the interface.

11. The process according to claim 7, wherein:
the semiconductor wafer has, as the uppermost layer, a layer including a component having a melting point substantially corresponding to the melting point of the at least one component of the negative photoresist; and
the uppermost layer melts at the interface when the negative photoresist layer is heated at the interface.

12. The process according to claim 7, wherein:
the uppermost layer has a component with a melting point substantially corresponding to the melting point of the at least one component of the negative photoresist; and
the component of the uppermost layer melts at the interface when the negative photoresist layer is heated at the interface.

13. A method of forming a structured photoresist layer on a semiconductor wafer, which comprises:
applying a positive photoresist layer over substantially all of an uppermost layer of the semiconductor wafer at an interface, the positive photoresist having components;
exposing portions of the positive photoresist layer to form a structure from the positive photoresist layer;
developing the positive photoresist layer to remove the positive photoresist layer in the exposed portions; and
heating the structured positive photoresist layer in a region of the interface to a temperature above a melting point of at least one of the components of the positive photoresist to fuse the positive photoresist at the interface with the uppermost layer.

14. The method according to claim 13, which further comprises carrying out the heating step to approximately 0.1° C. above the melting point of the at least one component of the positive photoresist.

15. The process according to claim 13, which further comprises producing substantially immediate solidification of the positive photoresist layer by cooling after the heating step.

16. The process according to claim 13, wherein:
the semiconductor wafer has, as the uppermost layer, a layer including a component having a melting point substantially corresponding to the melting point of the positive photoresist; and
the uppermost layer melts at the interface when the positive photoresist layer is heated at the interface.

17. The process according to claim 13, wherein:
the semiconductor wafer has, as the uppermost layer, a layer including a component having a melting point substantially corresponding to the melting point of the at least one component of the positive photoresist; and
the uppermost layer melts at the interface when the positive photoresist layer is heated at the interface.

18. The process according to claim 13, wherein:
the uppermost layer has a component with a melting point substantially corresponding to the melting point of the at least one component of the positive photoresist; and
the component of the uppermost layer melts at the interface when the positive photoresist layer is heated at the interface.

19. A method of forming a structured photoresist layer on a semiconductor wafer, which comprises:
applying a positive photoresist layer over at least a portion of an uppermost layer of the semiconductor wafer at an interface, the positive photoresist having components;
exposing portions of the positive photoresist layer to form a structure from the positive photoresist layer;

developing the positive photoresist layer to remove the positive photoresist layer in the exposed portions; and heating the structured positive photoresist layer in a region of the interface to a temperature above a melting point of at least one of the components of the positive photoresist to fuse the positive photoresist at the interface with the uppermost layer.

20. The method according to claim 19, which further comprises carrying out the heating step to approximately 0.1° C. above the melting point of the at least one component of the positive photoresist.

21. The process according to claim 19, which further comprises producing substantially immediate solidification of the positive photoresist layer by cooling after the heating step.

22. The process according to claim 19, wherein:

the semiconductor wafer has, as the uppermost layer, a layer including a component having a melting point substantially corresponding to the melting point of the positive photoresist; and the uppermost layer melts at the interface when the positive photoresist layer is heated at the interface.

23. The process according to claim 19, wherein:

the semiconductor wafer has, as the uppermost layer, a layer including a component having a melting point substantially corresponding to the melting point of the at least one component of the positive photoresist; and the uppermost layer melts at the interface when the positive photoresist layer is heated at the interface.

24. The process according to claim 19, wherein:

the uppermost layer has a component with a melting point substantially corresponding to the melting point of the at least one component of the positive photoresist; and the component of the uppermost layer melts at the interface when the positive photoresist layer is heated at the interface.

* * * * *